United States Patent [19]
Barbee et al.

[11] Patent Number: 5,648,113
[45] Date of Patent: *Jul. 15, 1997

[54] ALUMINUM OXIDE LPCVD SYSTEM

[75] Inventors: Steven George Barbee, Dutchess County, N.Y.; Jonathan Daniel Chapple-Sokol, Chittenden County, Vt.; Richard Anthony Conti, Westchester County, N.Y.; Richard Hsiao, Santa Clara County, Calif.; James Anthony O'Neill, Rockland County, N.Y.; Narayana V. Sarma, Dutchess County, N.Y.; Donald Leslie Wilson, Orange County, N.Y.; Justin Wai-Chow Wong, Chittenden County, Vt.; Steven Paul Zuhoski, Dallas County, Tex.

[73] Assignee: International Business Machines Corporation, Armonk, N.Y.

[*] Notice: The term of this patent shall not extend beyond the expiration date of Pat. No. 5,614,247.

[21] Appl. No.: 316,311

[22] Filed: Sep. 30, 1994

[51] Int. Cl.$^6$ .................................................. C23C 16/52
[52] U.S. Cl. ................... 427/8; 427/126.4; 427/226; 427/248.1; 427/255.3
[58] Field of Search ............................ 427/8, 126.4, 226, 427/248.1, 255.1, 255.3; 118/715

[56] References Cited

U.S. PATENT DOCUMENTS

| | | | |
|---|---|---|---|
| 4,187,336 | 2/1980 | Gordon | 428/34 |
| 4,675,089 | 6/1987 | Lory et al. | 204/164 |
| 4,696,833 | 9/1987 | Monnig et al. | 437/225 |
| 4,947,789 | 8/1990 | Hussla et al. | 118/715 |
| 4,997,677 | 3/1991 | Wang et al. | 427/248.1 |
| 4,999,219 | 3/1991 | Klinedinst et al. | 427/69 |
| 5,029,554 | 7/1991 | Miyashita et al. | 118/715 |
| 5,070,815 | 12/1991 | Kasai et al. | 118/725 |
| 5,091,207 | 2/1992 | Tanaka | 427/8 |
| 5,160,542 | 11/1992 | Mihira et al. | 118/715 |
| 5,173,328 | 12/1992 | Reiter et al. | 427/576 |
| 5,223,305 | 6/1993 | Tanaka et al. | 427/255.7 |
| 5,356,476 | 10/1994 | Foster et al. | 118/725 |
| 5,431,734 | 7/1995 | Chapple-Sokol et al. | 118/712 |

OTHER PUBLICATIONS

Aboaf, "Deposition and Properties of Aluminum Oxide Obtained by Pyrolytic Decomposition of Aluminum Alkoxide", J. Electrochem. Soc., 116, 1967, vol. 14, No. 9, pp. 948–952. (no month).

IBM Technical Disclosure Bulletin, vol. 11 No. 2, Jul. 1968, "Formation and Control of Stable P-Type Surfaces on Semiconductors", J.A. Aboaf et al. pp. 121.

J. Electrochem Society, 116, 1967, vol. 14, No. 9, pp. 948–952, pp. 948–952, J.A. Aboaf, "Deposition and Properties of Aluminum Oxide Obained by Pyrolytic Decmposition of an Aluminum Alkoxide" (Month no available).

*Primary Examiner*—Shrive Beck
*Assistant Examiner*—Timothy H. Meeks
*Attorney, Agent, or Firm*—Whitham, Curtis, Whitham & McGinn; Alison Mortinger

[57] ABSTRACT

A process and apparatus for $Al_2O_3$ CVD on silicon wafers using aluminum tri-isopropoxide in a high-volume production environment is presented. The conditions required to use ATI in a production environment and provide maximum utilization of ATI are first of all delivery of ATI via direct evaporation. The ATI source bottle is pumped out (bypassing substrates) until propene and isopropanol signals are reduced to 1% of process pressure before start of aluminum oxide deposition. Either IR spectroscopy or mass spectrometry can be used to provide a control signal to the microprocessor controller. Heating the supplied tetramer to 120° C. for two hours assures complete conversion to trimer. The ATI is stored at 90° C. to minimize decomposition during idle periods and allow recovery of trimer upon return to 120° C. for two hours. During periods of demand, the ATI is held at 120° C. to minimize decomposition.

12 Claims, 5 Drawing Sheets

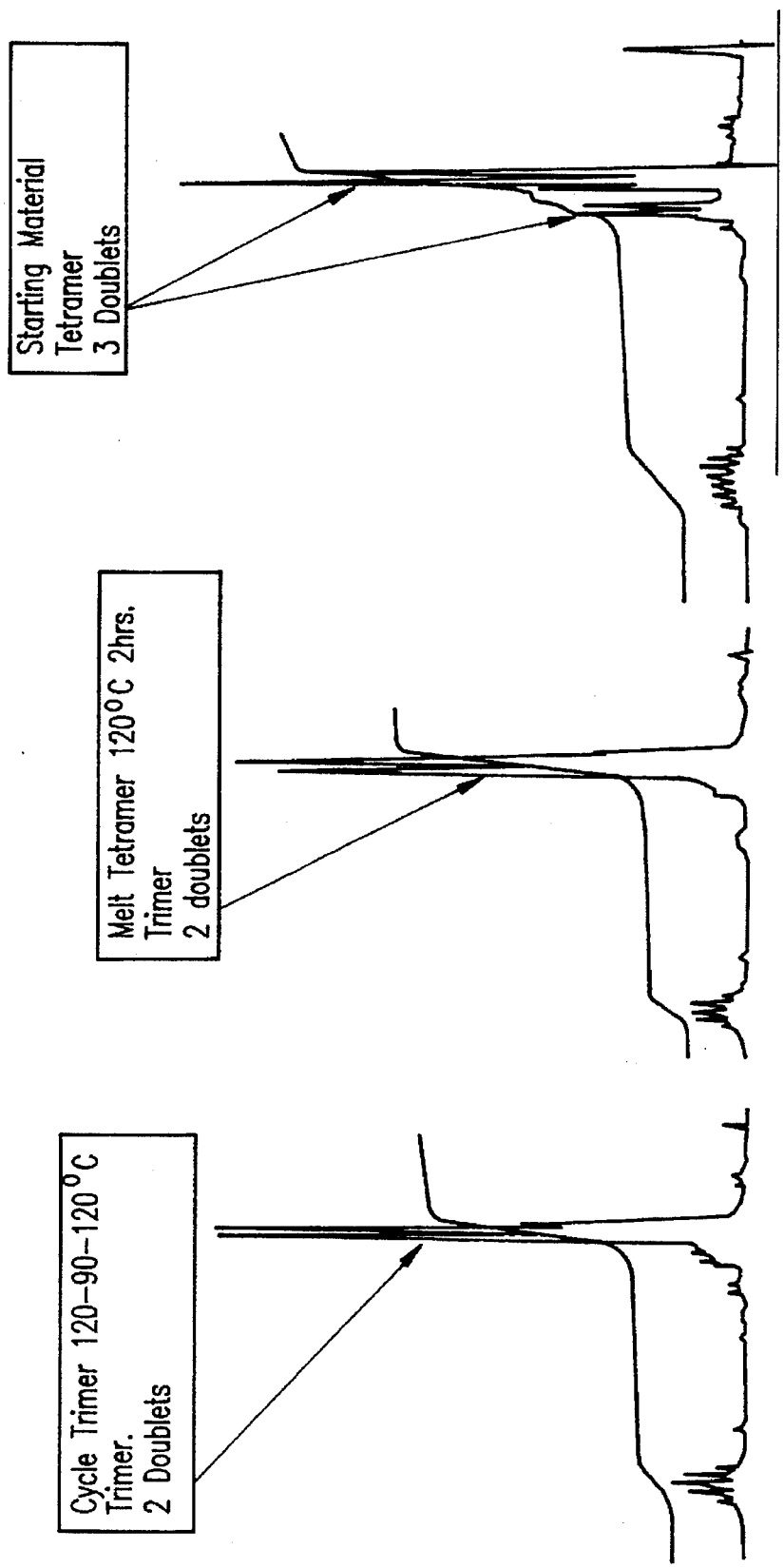

ALUMINUM OXIDE LPCVD SYSTEM

FIELD OF THE INVENTION

The present invention generally relates to the chemical vapor deposition (CVD) of dense thin aluminum oxide ($Al_2O_3$) films on silicon substrates in the manufacture of semiconductor devices and, more particularly, to an improved method and apparatus for the low pressure chemical vapor deposition (LPCVD) of aluminum oxide films using aluminum tri-isopropoxide $Al(OC_3H_7)$, known in the art as ATI, as a precursor to aluminum oxide in a high volume manufacturing environment.

BACKGROUND OF THE INVENTION

The utility of CVD $Al_2O_3$ as a reactive ion etch (RIE) stop layer (during tungsten contact stud patterning) has been clearly demonstrated. For this application, a dense aluminum oxide film is defined as having the following characteristics:

Index of refraction: 1.59–1.62, at 632.8 wavelength

Etch rate (3.6% phosphoric acid at 75° C.): <25 nm/min

Hydroxyl content (OH, by infrared (IR) spectroscopy, absorbance per micron of film thickness at 3500 $cm^{-1}$): <0.005

Shrinkage of film thickness upon annealing (30 min. at 500° C.): <1.5%

The literature indicates that aluminum tri-isopropoxide ($Al(OC_3H_7)$), known in the art as ATI, is a viable sub-500° C. $Al_2O_3$ precursor. See, for example, J. A. Aboaf, *J. Electrochem. Soc.*, 114, 948 (1967), J. Fournier et at., *Mat. Res. Bull.*, 23, 31 (1988), J. Kwon, J. Saraie and Y. Yodogawa, *J. Electrochem Soc.*, 132, 890 (1985), H. Mutoh et al., *J. Electrochem. Soc.*, 122, 987 (1975), and R. W. J. Morssinkhof et al., "Mechanistic Aspects of the Deposition of Thin Alumina Films Deposited by MOCVD", paper presented at Spring Meeting of the Materials Research Society, San Francisco, Calif. (1990). In these references, ATI is utilized under conditions in which 1) only bubbling is used to deliver ATI to the reactor, 2) a variety of ATI operating temperatures (78°–170° C.) is practiced, 3) deposition repeatability is not demonstrated, and 4) only a single substrate requires coating. However, while the literature describes the use of ATI for $Al_2O_3$ deposition, the literature describes bubbling techniques for delivery of ATI but fails to present a workable manufacturing process. In fact, the bubbling technique described in the literature will not work in a manufacturing environment for the reasons discussed in more detail below.

SUMMARY OF THE INVENTION

It is therefore an object of the present invention to provide a process of chemical vapor deposition (CVD) of dense $Al_2O_3$ on silicon wafers using aluminum tri-isopropoxide in a high-volume production environment.

It is another object of the invention to provide a process and apparatus for aluminum oxide CVD which insure growth rate repeatability.

It is a further object of the invention to provide an apparatus which maximizes the utilization of ATI source material in a LPCVD aluminum oxide process.

According to the invention, there is provided a method to use aluminum tri-isopropoxide (ATI) for chemical vapor deposition of aluminum oxide in a high volume manufacturing environment in which the ATI is stored during periods of no production demand at a temperature no less than 90° C. but not greater than 95° C. and the ATI temperature is raised to a nominal temperature of 120° C. in preparation for a period of production demand. During periods of production, the temperature of the ATI is maintained at a temperature not greater than 125° C. A critical feature in the practice of the method according to the invention is that the ATI is transported to the reaction chamber by direct evaporation or liquid injection without bubbling. The ATI is directed to a reactor bypass in lieu of to the CVD reactor during a start up period, the flow through this bypass is maintained until the concentration of ATI is determined to be sufficiently pure, typically greater than 99%. When the concentration of the ATI in the reactor supply line has reached the prescribed level, the ATI is directed to the CVD reactor. A chamber conditioning step may then be induced to minimize "first wafer" film degradation due to competition between the chamber and wafer for the reactant ATI. The temperature of the ATI source is reduced to about 90° C. upon termination of the production demand period.

According to another aspect of the invention, an apparatus is provided for depositing aluminum oxide on a substrate, which apparatus performs the foregoing method. The apparatus includes a pressure vessel containing aluminum tri-isopropoxide source material from which a source chemical vapor is produced. A delivery manifold is connected to the pressure vessel and selectively delivers the source chemical vapor to first or second outputs. An isothermal oven containing the pressure vessel and the delivery manifold heats the same. Pressure and temperature within said pressure vessel are monitored. A chemical vapor deposition chamber is provided with gas injector nozzles for injection of gas into the chamber. An insulated and temperature controlled exhaust line is connected to the first output of said delivery manifold and to the chemical vapor deposition chamber to provide a temperature controlled exhaust from the delivery manifold and the chemical vapor deposition chamber. A temperature controlled delivery line is connected at a first end thereof to the second output of the delivery manifold. A temperature controlled pressure differential type flow controller (such as an MKS Model 1151B) is connected to the second end of the delivery line for providing accurate flow of said source chemical vapor through the delivery line. A premix chamber, including a temperature controlled valved premix manifold assembly, is connected to the pressure differential mass flow controller. The premix manifold assembly has first and second outputs, the first output of the premix manifold assembly comprising a chamber for allowing the source chemical vapor to be mixed with a mass flow controlled, preheated gas. The first output of the premix manifold assembly is connected to the gas injectors of the chemical vapor deposition chamber for injection of the mixed source chemical vapor and gas therein. The second output of the premix manifold assembly is connected to the exhaust line. A controller is connected to the delivery manifold, heating device, the process vessel monitoring sensors, the exhaust line, the delivery line, the pressure differential mass flow controller, and the premix manifold assembly for controlling the pressure and the temperature of source chemical vapor being delivered throughout the same to be substantially constant thereby minimizing potential condensation and/or decomposition of the source chemical vapor during delivery. The controller additionally controls the delivery of the source chemical vapor from the pressure vessel to the exhaust line, the delivery line, the premix manifold assembly, and the chemical vapor deposition chamber according to prescribed deposition process parameters.

According to another aspect of the invention, parameter settings are selected for operation of the chemical vapor deposition chamber that is provided for depositing aluminum oxide on a substrate. The parameter settings are chosen such that an aluminum oxide film of high density is deposited repeatably and efficiently for a low temperature fabrication application (less than 450° C.). An efficient deposition is one wherein deposition occurs on the workpiece only and not on the ATI delivery system plumbing or the reactor chamber walls. A repeatable deposition process is one where the thickness and quality of the film do not vary from batch to batch.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A, 3B and 3C are graphs of the nuclear magnetic resonance (NMR) spectra of the ATI tetramer to trimer conversion under differing conditions;

DETAILED DESCRIPTION OF A PREFERRED EMBODIMENT OF THE INVENTION AND BEST MODE FOR PRACTICE OF THE INVENTION

Figure 1:
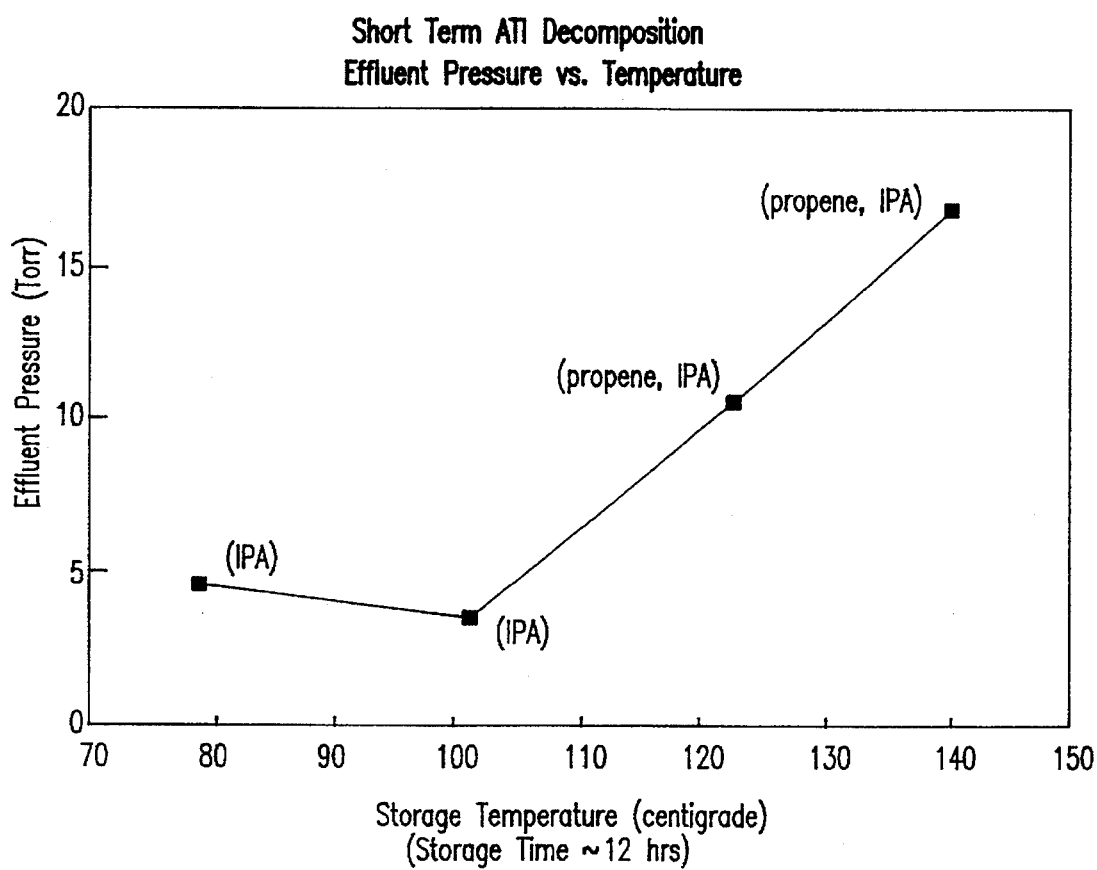
FIG. 1 is a graph showing short term ATI decomposition as effluent pressure versus temperature.

Generation of ATI vapor by means of bubbling is not a feasible method to deliver a controlled amount of this precursor gas to the process reactor. While bubbler systems are typically operated under conditions where the carrier gas is said to be "saturated" with the vapor of the condensible precursor, the amount of vapor which is actually entrained in a carrier stream depends on a number of factors. These parameters include the temperature of the storage vessel as well as its thermal stability, the level of liquid in this vessel, and the flow rate and temperature of the carrier gas. A change in any of these parameters will affect the concentration of precursor which is delivered to the process reactor. Physical and chemical properties which are specific to ATI make delivery of the vapor of this material by means of bubbling even more difficult. The aluminum isopropoxide molecule is a solid at room temperature and must be heated to 120° C. to achieve a nominal 1 Torr pressure to allow its delivery to the reaction chamber. At this constant temperature, ATI is moderately unstable and decomposes into volatile products whose vapor pressures are greater than that of the parent material, see analytical data shown in table below and in FIG. 1. Partial decomposition also results in changes in the liquid phase leading to a reduction of the vapor pressure of the ATI.

TABLE

EFFECT OF T ON VAPOR PRESSURE AND DECOMPOSITION

| Storage T (°C.) | Vapor pressure (torr) | % decomposed (30 days) |
|---|---|---|
| 120 | 1.0 | .60 |
| 130 | 2.0 | 1.1 |
| 140 | 4.5 | 2.0 |

In addition, ATI has the tendency to serf-associate, and it forms dimeric, trimeric and tetrameric phases, each of which has a different vapor pressure. The presence of decomposition products, the inherently low vapor pressure of ATI and changes in the phase of the material make bubbling impractical for the delivery of ATI vapor to the process reactor.

Control of the delivery of aluminum tri-isopropoxide $(Al(OC_3H_7)_3)$ that is used in the CVD aluminum oxide process is difficult due to ATI's 1) trimer/tetramer phase window and 2) slow thermal decomposition. ATI-based CVD process development was conducted at International Business Machines Corp. (IBM) using direct evaporation from an ATI source bottle. Bubbling was judged inconsistent with the achievement of high throughput batch process. A "single wafer-like" system with individual substrate temperatures and flow control to six stations was selected for process development.

During development, poor growth rate repeatability was observed. Over long periods, the growth rate pattern manifested as a gradual rise in growth rate over a series of four to six runs (within a day) to a maximum and an eventual decrease of this daily maximum over a period of several weeks as the ATI source bottle was depleted. In addition, a gradual rise in ATI source bottle pressure was observed over periods as short as an hour (depending on the source temperature).

Figure 2A:
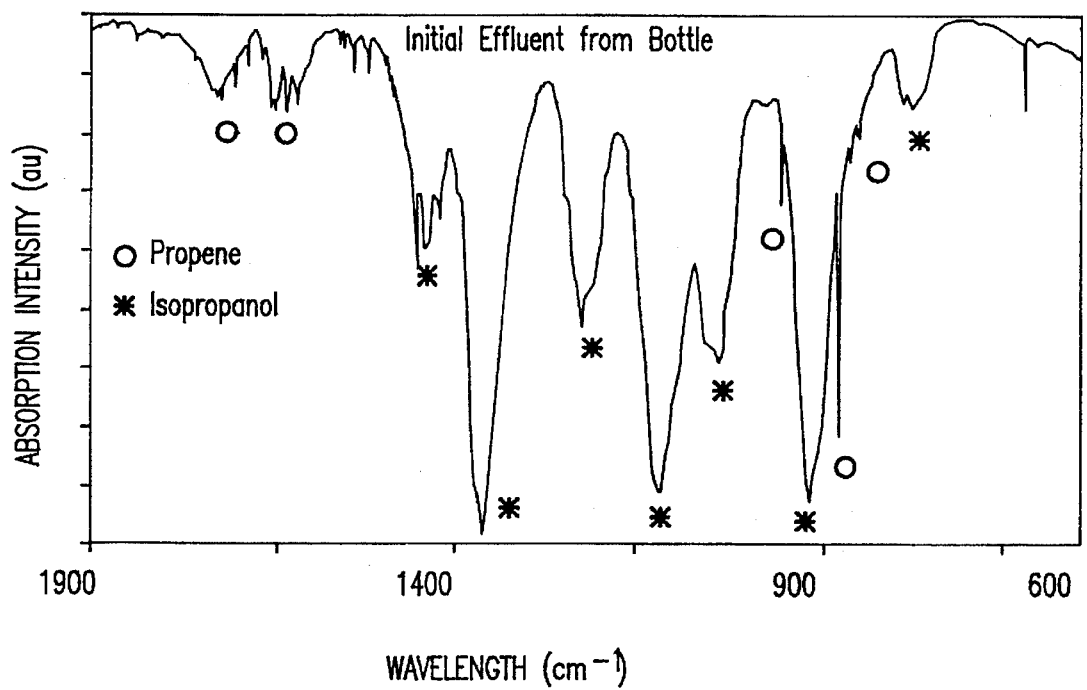
FIG. 2A is a graph of the infrared (IR) spectra of the initial ATI effluent from the bottle.
Figure 2B:
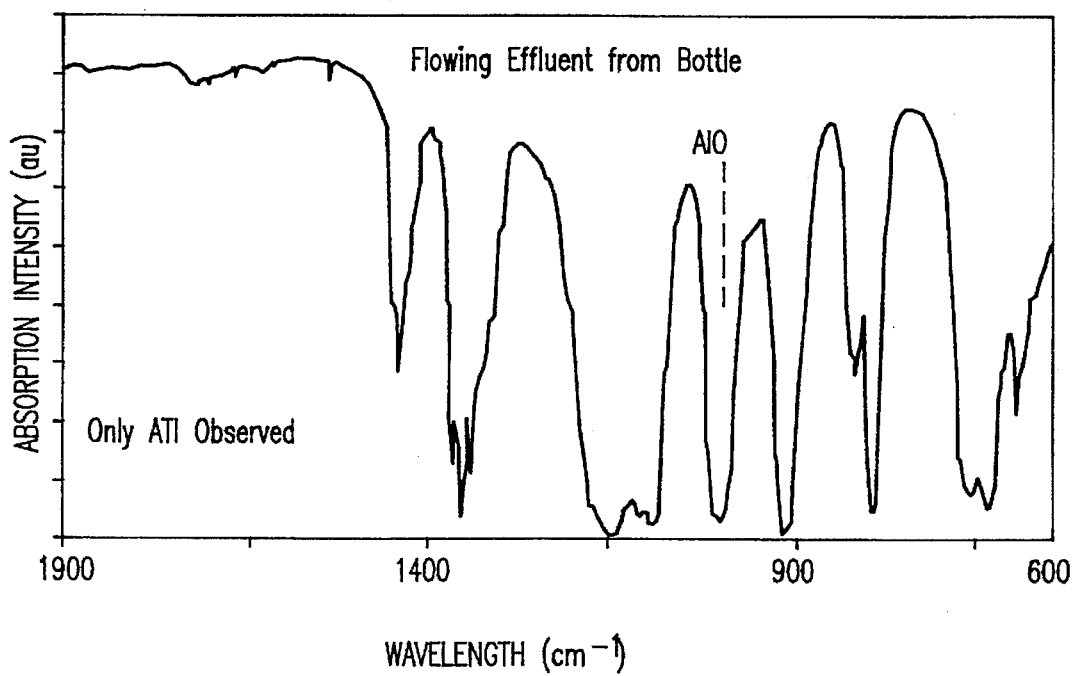
FIG. 2B is a graph of the IR spectra of the flowing ATI effluent from the bottle after the decomposition products have been removed.

The poor growth rate reproducibility suggests that ATI is not sufficiently stable under the wide variety of temperatures, as is suggested in the CVD literature. There is in fact a tendency of ATI to decompose at higher temperatures. IR and mass spectroscopy have been used to identify the volatile ATI decomposition products as isopropanol and propene, as shown in FIG. 2. A possible decomposition sequence is

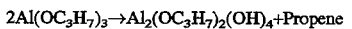

$2Al(OC_3H_7)_3 \rightarrow Al_2(OC_3H_7)_2(OH)_4 + Propene$

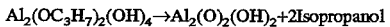

$Al_2(OC_3H_7)_2(OH)_4 \rightarrow Al_2(O)_2(OH)_2 + 2 Isopropanol$

The aluminum tri-isopropoxide hydroxide and oxide hydroxide are involatile.

In the literature, decomposition of ATI is reported to occur only at temperatures above 170°–200° C., and none of the reported CVD work indicates any difficulty in controllably delivering ATI. This stands in direct contrast to the instability observed at IBM when operating ATI at temperatures well below 170° C. Over the short term, stable growth rates could only be achieved after pump out of ATI decomposition products even when operating ATI as low as 115° C.

The fall off of decomposition rate with temperature suggests that a minimum storage (no ATI demand) and operating (ATI demand) temperature be used. However, a selection of these minima is complicated by ATI's trimer/tetramer equilibria and the need for sufficient vapor pressure to allow 1.0 sccm flow per wafer. At least 1 sccm of ATI is required to achieve a minimum allowable growth rate of 150 Å/min. Formation of trimer/tetramer mixture with a high tetramer content (>5%) must be avoided as the tetramer is not volatile. Since ATI is supplied as a solid in tetramer form, determination of a minimum operating temperature required to convert the tetramer to trimer was required.

For operation, a temperature of 120° C. was found sufficient to guarantee complete conversion to trimer in two hours and provide sufficient vapor pressure to allow a nominal 1.0 sccm flow per wafer. However, a minimum storage temperature can not be selected at random due to ATI's trimer and tetramer phase equilibria. Prolonged storage at temperatures below 80° C. causes changes in melting point that likely indicate phase transformation to the involatile tetramer. However, prolonged storage (e.g., 30 days) at 90° C. does not prevent recovery of the trimer (two hours at 120° C.). Results of an investigation of the tetramer to trimer conversion using NMR spectroscopy are shown in FIGS. 3A, 3B and 3C. Therefore, by storing at 90° C., decomposition during often lengthy idle periods can be minimized without irreversibly altering the ATI phase.

As a result of slow thermal decomposition, propene and isopropanol are evident in the gas phase. During formation of these gas phase species, irreversible changes also occur in the ATI melt. Elemental analysis of the melt remaining, after using 85–90% of an initial charge, indicate that the melt is aluminum rich (16.3% versus 13.2% expected for ATI). This suggests existence of a catenated system of Al—O—Al linkages. This Al—O—Al linkage-containing material is miscible with ATI due to its similar nature. During storage/operation, as the ATI content of the melt falls due to evaporation and slow decomposition, the available ATI vapor pressure will fall as predicted by Raoult's law. As a result, the flow delivered from a source container operating without constriction will drop with time. A CVD system operating under such a maximum-flow protocol (either by direct evaporation or bubbling) will exhibit growth rates that are out of control. Such a process would not be operable in a production environment.

Figure 4:
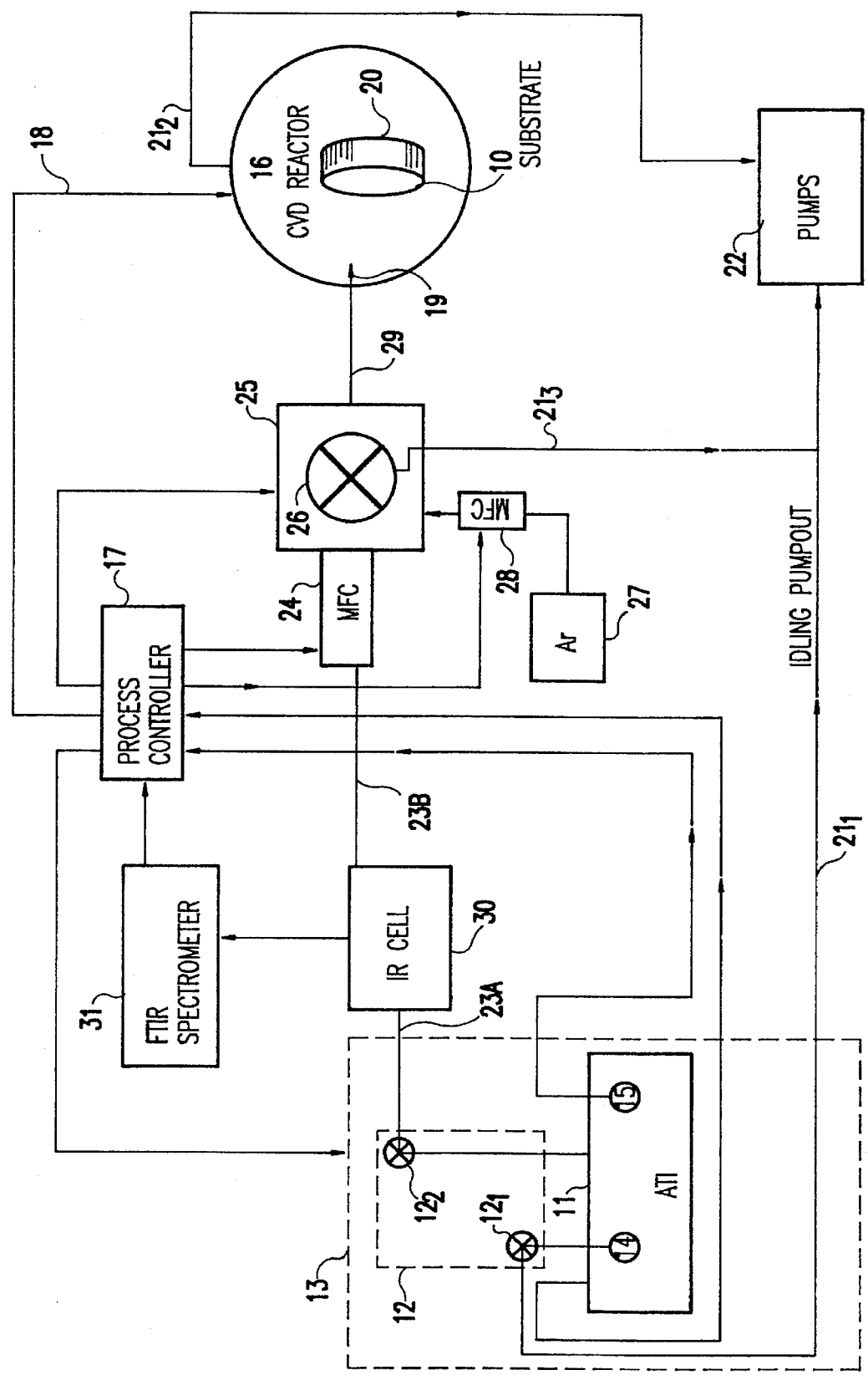
FIG. 4 is a block diagram showing the major components of the apparatus for depositing thin films of aluminum oxide on wafers according to a preferred embodiment of the invention.

Referring now to FIG. 4 of the drawings, there is shown an apparatus for depositing aluminum oxide on a substrate according to a preferred embodiment of the invention. A pressure vessel 11 contains aluminum tri-isopropoxide (ATI) source material from which a source chemical vapor is produced. A delivery manifold 12, including a pair of valves $12_1$ and $12_2$, is connected to the pressure vessel 11 and has first and second outputs respectively connected to these two valves. The valves $12_1$ and $12_2$ of the delivery manifold selectively deliver the ATI source chemical vapor to the first or second output. An isothermal oven 13 contains the pressure vessel 11 and the delivery manifold 12 for heating them and maintaining them at an accurate, controlled temperature. Sensors 14 and 15 respectively monitor pressure and temperature within the pressure vessel 11.

A chemical vapor deposition (CVD) process chamber 16 has wall temperature control by the process controller 17, as indicated by control line 18. The CVD process chamber 16 also has at least one gas injector nozzle 19 for injection of gas into the chamber and a heated susceptor or chuck 20 which holds a workpiece 10, such as a silicon wafer substrate, on which aluminum oxide films are to be deposited. Insulated and temperature controlled exhaust lines $21_1$, $21_2$, and $21_3$ are respectively connected to the first output of said delivery manifold 12 and to CVD process chamber 16 for providing a temperature controlled exhaust from the delivery manifold and the CVD process chamber to a vacuum pump 22. A temperature controlled delivery line 23 is connected at the first end thereof to the second output of said delivery manifold 12. The delivery line 23 has a cross section so as not to restrict the mass flow of the ATI source chemical vapor for a desired deposition rate of aluminum oxide on a wafer. A temperature controlled pressure differential mass flow controller (MFC) 24 is connected to the second end of the delivery line 23 and, under the control of process controller 17, provides a controlled flow of the ATI source chemical vapor through the delivery line 23.

A premix chamber 25 including a heated and insulated valve premix manifold assembly 26 is connected to the pressure differential mass flow controller 24. The premix manifold assembly 26 has first and second outputs. The first output of said premix manifold assembly 26 comprises a chamber for allowing the ATI source chemical vapor to be mixed with a mass flow controlled, preheated gas, such as argon from source 27. This gas is delivered via mass flow controller (MFC) 28 to the premix manifold assembly 26, preferably at a rate of 200 sccm. The first output of the premix manifold assembly 26 is connected by line 29 to the gas injector nozzle 19 of the CVD process chamber 16 for injection of the mixed ATI source chemical vapor and other gas therein. The second output of the premix manifold assembly 26 is connected to the exhaust line $21_3$.

The process controller 17 is a microprocessor based controller and is connected to the delivery manifold 12, the oven 13, the pressure vessel monitoring sensors 14 and 15, the exhaust lines $21_1$, $21_2$ and $21_3$, the delivery line 23, the mass flow controller 28 and pressure differential mass flow controller 24, and the premix manifold assembly 26 for controlling the pressure and the temperature of the ATI source chemical vapor being delivered throughout the system to be substantially constant thereby minimizing potential condensation and/or decomposition of the ATI source chemical vapor during delivery. The process controller 17 further controls the delivery of the ATI source chemical vapor from the pressure vessel 11 to the exhaust lines $21_1$, $21_2$ and $21_3$, the delivery line 23a and 23b, the premix manifold assembly 26, and the CVD process chamber 16 according to prescribed deposition process parameters.

The delivery line 23 leads to an infrared (IR) cell 30. A Fourier transform infrared (FTIR) spectrometer 31, or other IR sensing device, proximate to the IR cell 30 analyzes the composition of vapor flowing through the IR cell 30 before it travels to the chemical vapor deposition chamber 16. The FTIR spectrometer 31 sends information to the process controller 17 which controls the valve of the premix manifold assembly 26. The process controller 17 operates the valve of the premix manifold assembly 26 based upon the information it receives from the FTIR spectrometer 31. The delivery line 23 leads from the IR cell 30 through the mass flow controller (MFC) 24 to the valve of the premix manifold assembly 26. The outputs from this valve are a line 29 leading to the CVD process chamber 16 and the exhaust line $21_3$ leading to the system pump 22.

When the reactant vapor flowing in the IR cell 30 is analyzed by the FTIR spectrometer 31, information is given to the process controller 17 indicating whether contaminants or decomposition products are present. A composition of reactant vapor which is harmful to the reactor or workpiece within the reactor will cause the process controller 17 to operate the valve of the premix manifold assembly 26 to switch such that the ATI chemical source vapor will proceed through exhaust line $21_3$ to pump 22, rather than through line 29 to the chemical vapor deposition chamber 16. If the composition of the ATI chemical source vapor is appropriate, the valve of the premix manifold assembly 26 will be operated to direct the ATI chemical source vapor through line 29 to nozzle 19 in the CVD process chamber 16 and proceed to reaction on workpiece 10.

The process controller 17 operates to control the temperature of the ATI in pressure vessel 11 during periods of no production demand at a temperature at no less than 90° C. but not greater than 95° C. During periods of no production demand, the ATI is stored under vacuum. The process controller 17 raises the ATI temperature to a temperature no greater than 125° C. in preparation for a period of production demand and maintains the ATI during periods of production demand at a temperature not greater than 125° C. The ATI chemical vapor is transported to the CVD process chamber 16 via direct evaporation. To improve delivery of the ATI chemical vapor during periods of production demand, the ATI pressure vessel 11 may be agitated. The ATI chemical vapor is directed to the reactor bypass exhaust line $21_3$ in lieu of nozzle 19 in CVD process chamber 16 during a start up period and maintaining flow to the bypass exhaust line $21_3$ until the concentration of ATI chemical vapor in the delivery line 23 as measured by the IR cell 30 and FTIR Spectrometer 31, is greater than a prescribed level, typically greater than 99%. The ATI chemical vapor is directed to nozzle 19 in the CVD process chamber 16 through line 29 after the concentration of ATI chemical vapor in the reactor supply line has reached a prescribed level, typically greater than 99%, for deposition of aluminum oxide on the workpiece 10. The temperature of the ATI chemical pressure vessel is again reduced to about 90° C. upon termination of the production demand period.

Figure 5:
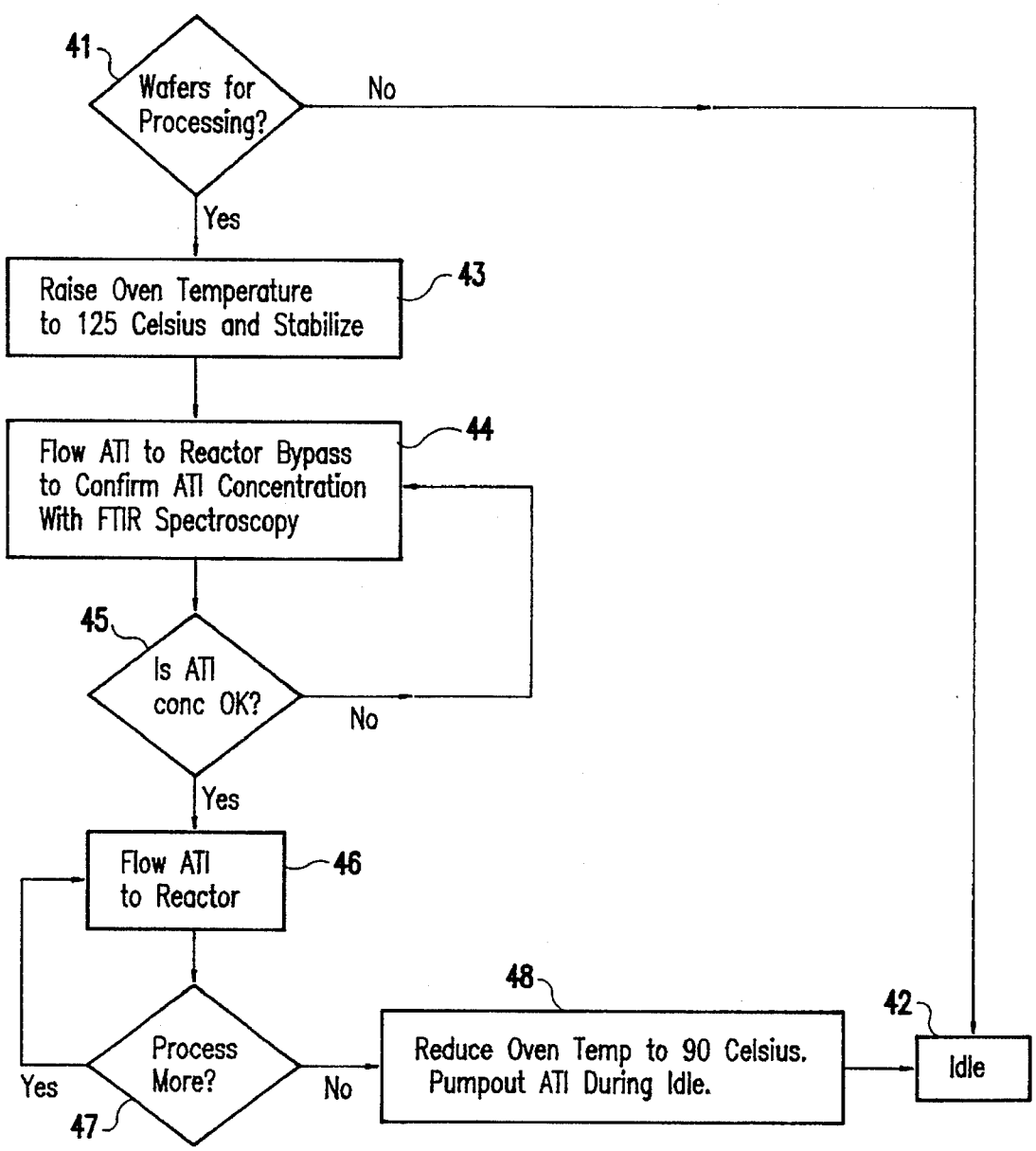
FIG. 5 is a flow diagram showing the control of the apparatus shown in FIG. 4 by the microprocessor controller.

FIG. 5 is a flow diagram showing the process controlled by the microprocessor based process controller 17. On start up, the process controller 17 determines whether there are wafers ready for processing, as indicated by decision block 41. If not, the system idles at function block 42 until wafers are present for processing. Once wafers are ready for processing in CVD process chamber 16, the oven 13 temperature is raised to 125° C. and stabilized, as indicated by function block 43. Then, the ATI is flowed through delivery line 23 to the IR cell 30 and, from there, via the valve in premix manifold assembly 26 to the exhaust line $21_3$, bypassing the process chamber 16 function block 44. Based on the output of FTIR spectrometer 31, the process controller 17 determines in decision block 45 whether the concentration of the reactant gas is sufficiently pure. If it is, the valve in the premix manifold assembly 26 is operated to flow the ATI vapor to the CVD process chamber 16 in function block 46. The flow of ATI to the CVD process chamber 16 continues until processing of the wafers is completed, as determined in decision block 47. At that point, the valve in premix manifold assembly 26 is actuated, the oven 13 temperature is reduced to 90° C., as indicated in function block 48, and pump out the ATI pressure vessel via exhaust line $21_1$ is accomplished during idle.

The literature references discuss a variety of reactor chamber wall temperatures from walls with no temperature control at all to those controlled at 225° C. to those that are at the same temperature as the workpiece (so called hot-walled systems). In addition, although some of the literature demonstrates deposition of high quality film, these references accomplish this at the expense of efficiency of deposition (by allowing deposition on the reactor walls in a hot walled case where homogeneous gas phase reaction will occur leading to high particulate formation) or at the expense of reduce workpiece capacity (by depositing at very low growth rates). Workpiece capacity will also be reduced in the hot wall case because deposition on the reactor leads to periodic cleaning of the reactor that reduces uptime. Furthermore, none of the literature references teaches how to repeatably deposit highly dense aluminum oxide via CVD using ATI. None of the literature references indicates the importance of maintaining both the reactor chamber wall and delivery plumbing temperatures in a tightly controlled range. None of the references discusses the repeatability performance of the thickness and film quality of the systems for film deposition taught by these references.

Operation in different pressure regimes is also discussed in the literature. Operation at atmospheric pressure is undesirable due to a tendency toward gas phase nucleation and resultant foreign material contamination to the workpiece. Although another reference demonstrates a process at 750 mTorr, even lower operating pressures are required for the exercise of a high volume manufacturing process due to the requirement that the ATI source be maintained at a temperature below 120° C.

Parameter settings of the CVD chamber that are critical in achieving the efficient and repeatable deposition of highly dense aluminum oxide rims at low workpiece temperatures and at high throughput include tightly controlled temperatures of the chamber wall and reactant gas injector system and a low chamber pressure. The temperature of the chamber walls and gas injectors must not be so low as to allow condensation upon these components but must not be so high as to allow decomposition of the ATI during delivery. Decomposition during delivery would not only reduce the efficiency of the use of the ATI, but would also alter the surfaces of wetted components giving rise to foreign material contamination and further sites for surface reactions. The efficient and repeatable delivery of ATI to the workpiece is based upon a minimization of ATI losses during transport and control of the condition of the surfaces through which the ATI is transported before reaching the workpiece. At low workpiece temperatures great care must be provided to avoid delivery of non-ATI species to the workpiece surface due to the known tendency of aluminum oxide to trap impurities such as water. For higher workpiece temperatures (above 500° C.), the tendency for impurities such as water to be trapped by the growing aluminum oxide film will be reduced. However, there will be a greater tendency for other impurities such as carbon to be trapped. The application of ATI for deposition of aluminum oxide at low workpiece temperatures precludes the use of warm-walled CVD chamber (where the chamber walls will be at temperatures between 135° C. and 225° C. or greater) because products of the decomposition reaction occurring on the walls of the chamber may interfere with the deposition of high density films on the workpiece. Hot-walled systems suffer from inefficient usage of the ATI precursor and the need to periodically clean the reactor walls reducing the system's throughput or periodic replacement of the reactor chamber raising the system cost.

Low pressure is required for the use of an ATI delivery system that is based upon direct evaporation and to reduce the incidence of gas phase reaction that may also produce decomposition products that may interfere with the deposition of high density films on the workpiece or produce particulate contamination.

The temperature of the chamber walls should be controlled at a temperature greater than the temperature of the ATI vessel but limited to a temperature of 5° C. above the ATI vessel and preferably at a temperature no higher than 125° C. Consistent with the use of direct evaporation to deliver the ATI, the pressure of the chamber should be less than the vapor pressure of the ATI at the ATI vessel temperature and should preferably be less than 200 mTorr.

In summary, the conditions required to use ATI in a production environment and provide maximum utilization of ATI according to the present invention are:

1. Delivery of ATI via direct evaporation. Since the vapor pressure of the ATI melt varies with time, the use of bubbling does not provide a constant partial pressure of ATI. With direct evaporation, one can throttle back on the requested flow so that the delivery will be insensitive to vapor pressure changes.
2. Pump out of ATI source bottle (bypassing substrates) until propene and isopropanol signals are reduced to less than some prescribed level, preferably less than 1% of process pressure before start of aluminum oxide deposition. Either IR spectroscopy or mass spectrometry can be used to provide a control signal to the microprocessor controller.
3. Heating as supplied tetramer to 120° C. for two hours to assure complete conversion to trimer.
4. Storage of ATI at 90° C. to minimize decomposition during idle periods and allow recovery of trimer upon return to 120° C. for two hours.
5. Operation of ATI between 115° and 125° C. and preferably at 120° C. to minimize decomposition during periods of demand.
6. Controlling the temperature of the reactor chamber, the ATI delivery plumbing, and the reactant gas injector system to a temperature less than 5° C. above the ATI vessel temperature and preferably less than 125° C.
7. Operation of the reactor chamber at a pressure of less than the ATI vapor pressure at the ATI vessel temperature and preferably at less than 200 mTorr.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of depositing a dense aluminum oxide upon a substrate comprising the steps of:
   a) providing a vacuum processing chamber, the processing chamber having at least one gas injector nozzle for injection of gas into the chamber, a heated susceptor upon which is placed said substrate, and temperature controllable walls;
   b) providing a chemical vapor delivery system having a premix chamber connected to the processing chamber, the chemical vapor delivery system controllably generating and delivering a chemical vapor from a source of aluminum tri-isopropoxide (ATI);
   c) heating the ATI source to a temperature sufficient to provide a flow of the chemical vapor through the chemical vapor delivery system by direct evaporation of ATI;
   d) pumping out said chemical vapor from the ATI source, bypassing the processing chamber, until a predetermined purity of the chemical vapor is detected;
   e) controlling the flow of the chemical vapor in the chemical vapor delivery system to the processing chamber at a predetermined flow rate when said predetermined purity is detected;
   f) maintaining a process pressure within the processing chamber and the chemical vapor delivery system at a prescribed pressure;
   g) mixing a preheated inert gas with the flow of chemical vapor in the premix chamber to produce a gas mixture, the flow of inert gas being mass flow controlled; and
   h) injecting the gas mixture into the processing chamber so that the chemical vapor in the gas mixture reacts on the substrate to form an aluminum oxide film thereon.

2. The method of claim 1, wherein the temperature in step c) is between 115° and 125° C.

3. The method of claim 2, further comprising the step of maintaining a temperature of the processing chamber to less than 5° C. above the temperature of step c).

4. The method of claim 3, wherein the temperature in step c) is approximately 120° C. and the temperature of the processing chamber is less than 125° C.

5. The method of claim 1, wherein the flow of said chemical vapor in step e) is at least 1 sccm.

6. The method of claim 1, wherein the prescribed pressure in step f) is less than 200 mTorr.

7. The method of claim 1, wherein a nominal rate of inert gas flow is 200 sccm.

8. The method of claim 7, wherein the inert gas is Argon.

9. A method to use aluminum tri-isopropoxide (ATI) for chemical vapor deposition (CVD) of aluminum oxide, said method comprising the steps of:
   a) storing ATI during periods of no production demand at a temperature no less than 90° C. but not greater than 95° C.;
   b) storing ATI during periods of no production demand under vacuum;
   c) raising the ATI temperature to a temperature no greater than 125° C. in preparation for a period of production demand;
   d) maintaining ATI during periods of production demand at a temperature not greater than 125° C.;
   e) transporting ATI to a CVD reactor via direct evaporation;
   f) agitating the ATI during periods of production demand;
   g) directing the ATI to a reactor bypass in lieu of to the CVD reactor during a start up period and maintaining flow to the bypass until the concentration of ATI has reached a predetermined purity;
   h) directing the ATI to the CVD reactor after the concentration of ATI has reached a predetermined purity for deposition of aluminum oxide; and
   i) reducing the ATI temperature to about 90° C. after termination of the production demand period.

10. The method of claim 9, further comprising the step of maintaining the temperature of ATI during delivery prior to the period of production demand.

11. The method of claim 10, further comprising the step of maintaining the temperature of ATI during steps e–h.

12. The method of claim 11, wherein the pressure of the CVD reactor is less than an ATI vapor pressure.

* * * * *